United States Patent
Rümler et al.

(10) Patent No.: US 12,455,072 B2
(45) Date of Patent: Oct. 28, 2025

(54) PERFORATED ACOUSTIC PANEL, METHOD OF PRODUCING, AND USE OF THE SAME

(71) Applicant: KNAUF GIPS KG, Iphofen (DE)

(72) Inventors: Wolfgang Rümler, Neustadt an der Aisch (DE); Michael Viebahn, Ochsenfurt (DE); Markus Rießler, Wolpertshausen (DE); Goetz Viering, Kitzingen (DE)

(73) Assignee: KNAUF GIPS KG, Iphofen (DE)

( * ) Notice: Subject to any disclaimer, the term of this patent is extended or adjusted under 35 U.S.C. 154(b) by 70 days.

(21) Appl. No.: 18/251,372

(22) PCT Filed: Nov. 6, 2020

(86) PCT No.: PCT/EP2020/000188
§ 371 (c)(1),
(2) Date: May 1, 2023

(87) PCT Pub. No.: WO2022/096077
PCT Pub. Date: May 12, 2022

(65) Prior Publication Data
US 2024/0019116 A1 Jan. 18, 2024

(51) Int. Cl.
*F21V 33/00* (2006.01)
*E04F 13/08* (2006.01)
(Continued)

(52) U.S. Cl.
CPC ........ *F21V 33/006* (2013.01); *E04F 13/0866* (2013.01); *E04F 13/0867* (2013.01);
(Continued)

(58) Field of Classification Search
CPC .............. F21V 33/006; F21V 33/0012; F21W 2131/301; F21Y 105/10; F21Y 115/10
See application file for complete search history.

(56) References Cited

U.S. PATENT DOCUMENTS 9,459,399 B2* 10/2016 Krijn ................... F21V 33/0012
2007/0247842 A1 10/2007 Zampini et al.
(Continued)

FOREIGN PATENT DOCUMENTS

| EP | 2573461 A1 | 3/2013 |
| EP | 2985794 A1 | 2/2016 |

(Continued)

OTHER PUBLICATIONS

International Search Report and Written Opinion received for PCT/EP2020/000188, mailed Jun. 11, 2021.
(Continued)

*Primary Examiner* — William J Carter
(74) *Attorney, Agent, or Firm* — Greer, Burns & Crain, Ltd

(57) ABSTRACT

A perforated acoustic panel for mounting to a wall and/or a ceiling, including a visible front side and a rear side hidden by the panel when mounted is discussed. It is an objective of the disclosure to provide illuminating walls or ceilings. The objective is solved by a flexible printed circuit layer, FPC, attached to the rear side of the panel, the FPC comprising a plurality of LEDs, wherein each LED is arranged to be positioned to emit light through a perforation of the panel.

17 Claims, 3 Drawing Sheets

(51) Int. Cl.
*F21Y 105/10* (2016.01)
*F21Y 115/10* (2016.01)
*G10K 11/168* (2006.01)

(52) U.S. Cl.
CPC ..... *E04F 2290/026* (2013.01); *F21Y 2105/10* (2016.08); *F21Y 2115/10* (2016.08); *G10K 11/168* (2013.01)

(56) References Cited

U.S. PATENT DOCUMENTS

| | | | |
|---|---|---|---|
| 2014/0071662 A1* | 3/2014 | D'Antonio | F21V 21/04 362/311.06 |
| 2014/0092034 A1* | 4/2014 | Franklin | H05K 1/028 345/173 |
| 2014/0226360 A1 | 8/2014 | Krijn et al. | |

FOREIGN PATENT DOCUMENTS

| | | |
|---|---|---|
| EP | 3505823 A1 | 7/2019 |
| JP | 2014-204029 A | 10/2014 |
| JP | 2014-529864 A | 11/2014 |
| KR | 20110092422 A | 8/2011 |
| WO | 2009096802 A1 | 8/2009 |
| WO | 2013001430 A1 | 1/2013 |
| WO | 2013038292 A1 | 3/2013 |
| WO | 2013057610 A1 | 4/2013 |
| WO | 2013190447 A2 | 12/2013 |

OTHER PUBLICATIONS

Notification of Reasons for Refusal received for Japanese Application No. 2023-524900, mailed Feb. 6, 2025.
Notification of Reasons for Refusal received for Japanese Appl. No. 2023-524900, mailed Oct. 15, 2024.

* cited by examiner

PERFORATED ACOUSTIC PANEL, METHOD OF PRODUCING, AND USE OF THE SAME

BACKGROUND

The invention relates to a perforated acoustic panel according to claim 1, a method of producing a perforated acoustic panel according to claim 12, and a use of a perforated acoustic panel according to claim 13.

Room acoustics are an important factor that must be taken into consideration during building construction or renovation. Many public institutions such as classrooms and lecture halls, have strict regulations regarding room acoustics which must be adhered to, whilst areas such as offices and apartments require the noise management for comfort or even health, especially when open plan, minimalist furniture styles are employed. Additionally, room acoustics are a variable that need to be carefully controlled in environments such as theatres and music rooms to provide optimal conditions for their intended use.

A key factor used to indicate room acoustics is reverberation time. Reverberation time refers to the amount of time required for a sound to fade away inside an enclosed space. Sounds inside a room may reverberate when sound waves fail to be absorbed by surfaces they come into contact with, and instead of being absorbed are reflected off said surfaces.

This reverberation time can be reduced by modifying surfaces such that sound in a relevant frequency range is absorbed more, and the reflections are hence minimised. An open-pored, acoustically absorbent material such as mineral fibre/wool, polyester fibre, PUR foam or felt may be utilized for this effect.

For the improvement of room acoustics in the required environments, sound absorbing materials such as these may be utilized on wall, ceiling, and even floor surfaces. These sound absorbing materials may be sold with a finished surface such as mineral fibre ceilings, or the surface may be produced during the installation of these materials, for example on a perforated plasterboard ceiling which is attached to a suspension system of metal profiles or wooden slats with mineral wool backing. The sound absorbing material is typically located behind the perforated plasterboard.

Perforated surfaces of sound absorbing materials allow sound and/or air to flow through the material to increase the absorbing effect of the sound absorbing material behind. The perforations (holes) provide sound dampening properties that can be utilised in the acoustic management of a room. Said holes can provide acoustic dampening effects to the environment in which they are installed. These holes may have any one of a variety of shaped cross section, such as rectangular, square or circular. As the holes in the material, panel or board play a large part in providing the noise dampening effects of the material, hole distribution and size can thus be selected to provide the required sound dampening effects for a chosen environment.

An example of a perforated surface is the Knauf Cleaneo Akustikplatte (acoustic board). The sound dampening effect is achieved by the complete structure, including perforated plasterboards with a laminated film or fibre fleece on the side facing towards the wall, and with mineral wool in the cavity between plasterboard and wall. The structure also includes fastening means for attaching the boards to the wall.

Perforated sound absorbing panels, such as the Knauf Cleaneo Akustikplatte or the Knauf Cleaneo Acoustic linear panels, can be suspended from the a ceiling, whilst mineral fibre panels are often held in place via a grid-like railing structure which surround the edges of the individual panels. The sound absorbing material can be laid out in a manner that substantially conceals the edges and make the surface look like a plain wall.

The invention bases on the finding that a flexible printed circuit (FPC) can be combined with the perforated acoustic board to provide illumination in a production-efficient and cost-effective manner.

An advantageous embodiment of the invention provides that the first and second web sections are arranged in a first plane and a central region of the web bead in a second plane. Preferably, the aforementioned central region can be formed straight.

The complicated and expensive integration of illumination in acoustic boards according to the prior art is overcome by a perforated acoustic panel according to claim 1, the method of producing a perforated acoustic panel according to claim 12 and the use of a perforated acoustic panel according to claim 13.

SUMMARY

According to the invention, a perforated acoustic panel for mounting to a wall and/or a ceiling, the panel comprising a visible front side and a rear side opposite the front side, which is hidden when the panel is mounted. The perforated panel comprises at least one, preferably a plurality of perforations. The perforated panel is characterized by a flexible printed circuit layer, FPC, attached to its rear side, the FPC comprising a plurality of LEDs, each LED arranged to be positioned to emit light through a perforation of the panel. The FPC preferably is a paper FPC or a film FPC. LEDs (Light Emitting Diodes) shall in the context of this application also comprise OLEDs (Organic Light Emitting Diodes) or any other light source adapted to be integrated within a FPC.

In one embodiment, the panel comprises a gypsum body; and gypsum walls of the perforation reflect (i.e. direct) light emitted from the LEDs through the perforation.

Advantages include that the perforations in the acoustic panel naturally provide a light directing effect, in particular when the panel body is made of a light reflecting material, such as gypsum.

It has also been found that the light characteristics are modified by the plaster walls of the perforation, possibly due to reflection and absorption effects effectuated by the gypsum walls of the perforations.

The arrangement of the LEDs on the backside of the panel avoids disturbing glare. The comprehensive arrangement of LEDs eliminates shading effects.

In one embodiment, the LEDs mounted on the FPC are positioned to emit light through each perforation of the panel.

In one embodiment, the LEDs mounted on the FPC are positioned to emit light through some perforations of the panel.

A LED may be arranged in each perforation, or may not be provided in each perforation but only in some, e.g. in a clustered arrangement or a regular arrangement that regularly spares individual perforations. The number of LEDs per perforation depends on factors such as desired illumination effect, strength of each LED, etc.

In one embodiment, the FPC is attached with an attachment comprising an attachment free margin around each perforation in order to facilitate sound wave propagation through the FPC. Preferably, the attachment free margin is between 3 mm to 5 mm.

An important factor for good sound absorbing characteristics of the acoustic panel, is that the perforation allows sound waves to penetrate through the panel into the sound absorbing material behind the panel. If the FPC is too tightly attached to the panel, it will restrict sound penetration. The FPC should therefore preferably be loosely attached to the rear side of the panel, preferably only at certain points, and/or having a margin to the holes in the panel, allowing the FPC to vibrate with the sound wave to allow the sound to propagate to the cavity with sound absorbing material behind the panel. In order to further increase sound penetration, the FPC is preferably perforated at least over the panel perforations not containing LEDs.

In one embodiment, the FPC is of less than 1.5 mm thickness, preferably less than 1.2 mm thickness. For example, the substrate of the FPC (paper or film) can be about 0.1 mm thick, whereas the LEDs can have a height of about 0.8 mm. Substrate and LEDs together would have a thickness of about 0.9 mm. A reduced thickness of the FPC facilitates sound penetration and allows for lower mounting heights. Whilst paper is a particularly well suited material to be laminated onto a plasterboard other materials as a basic material for the FPC are also considered for forming a perforated acoustic panel according to the invention. In a preferred embodiment the FPC is a roll good, i.e. provided from a roll with a length of the FPC-material preferably being within 50 m to 150 m. The FPC-material is cut to provide the particular FPC intended to be attached or laminated onto the rear side of the panel.

According to another embodiment, the FPC is a film FPC.

According to one embodiment, the plurality of LEDs are emitting light perceived as white.

According to one embodiment, the LEDs are broad-spectrum LEDs.

According to one embodiment, the light emitted is perceived as white. This light is emitted by a combination of primary coloured, narrowband LEDs. The light intensity and light colour is adjustable by adjusting the intensity of each primary colour LED independently of the other primary colour LEDs.

Typically, illumination is preferably white. However, the panel may also be constructed with a certain coloured LED, or a combination of different coloured LEDs in each perforation, or in separate perforations. The LED intensity may be adjustable in order to adjust the intensity and/or the perceived colour of the illuminating panel.

The deficiency of the state of the art is further overcome by a method of producing a perforated acoustic panel according this disclosure.

In one embodiment, the method comprises the steps: arranging a FPC on the rear side of a perforated acoustic panel such that each of a plurality of LEDs arranged on the FPC is located over a perforation of the panel; and attaching the FPC to the panel such as by laminating, gluing or by aid of a connecting element such as for example by nailing or stapling. Other suitable means for attaching the FCP are possible.

Alternatively, the flange beads of one flange can be arranged along two, three or more lines, which are preferably parallel to each other. Those two, three or more straight lines can be oriented parallel to the longitudinal direction of the stud.

Advantageously, paper FCPs usually can be contacted very easily via sidelong contacting zones that allow a connection to every (lateral) part of the ceiling taking into account the electric connections provided in the building.

The deficiency of the state of the art is further overcome by the use of a perforated acoustic panel as described in this disclosure to illuminate a room.

The benefits and advantages of the method and use described herein are equal or similar to the advantages of the herein described panel.

BRIEF DESCRIPTION OF THE DRAWINGS

In the following, exemplary embodiments of the invention are described with respect to the figures, wherein FIG. 1 outlines a cross section of an illuminating acoustic panel.

DETAILED DESCRIPTION

Figure 1:
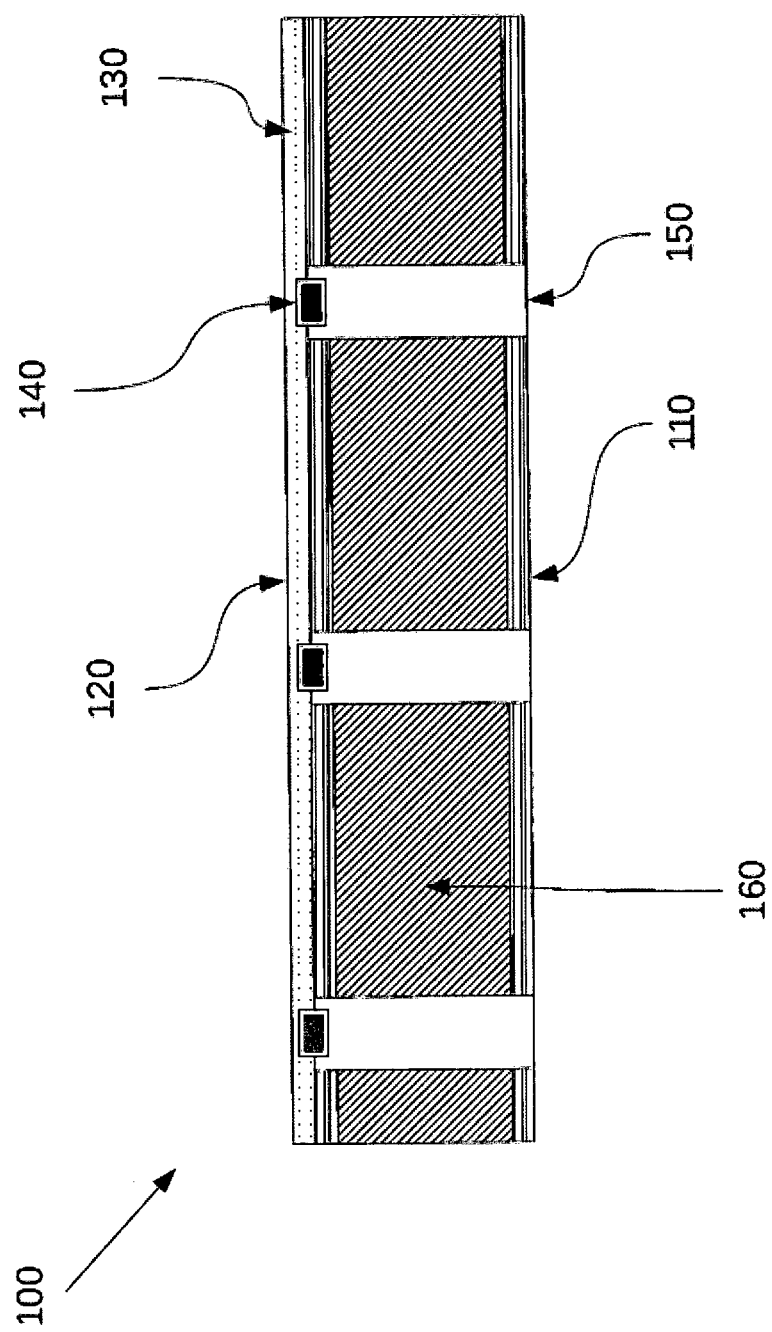

FIG. 1 shows a cross section of an illuminating acoustic panel 100. The panel comprises a front side 110 of the panel, a rear side 120 of the panel, a flexible printed circuit layer (FPC; 130) including one or more Light Emitting Diodes (LEDs; 140). The panel also comprises perforations 150 and a panel core 160, preferably a gypsum core. The acoustic panel according to this example is an acoustic plasterboard. The walls of the perforations 150 act as a light reflectors directing light through the perforations. This results in narrowed light beams compared to panels on which the LEDs are located on the front side of the panel. If the panel core 160 is a gypsum core the walls of the perforations have inherently a whitish colour and work as light reflectors without further treatment. In case the panel core 160 consists of another material, e.g. wood or else, it might be advisable to coat the perforation walls with a light reflecting material.

The FPC preferably is a paper FPC or a film FPC when used on acoustic plasterboards. When the FPC is a paper FPC, the paper is preferably less than 1.5 mm thick, and more preferably less than 1.2 mm thick. According to this example the paper substrate of the FPC is about 0.1 mm thick, and the mounted LEDs have a height of about 0.8 mm. Paper substrate and LEDs together have a thickness of about 0.9 mm. Since the acoustic panel is a plasterboard the use of a paper FPC is especially beneficial because plasterboards usually have paper liners and the attachment is thus facilitated. However, if the panel or its casing is made of other materials it can be more favourable to use film PFCs.

The panel 100 may be configured for mounting onto a wall and/or a ceiling (not shown). Sound absorbing material, such as mineral wool (not shown) may be arranged behind the panel (on the rear side 120 of the panel), when mounted. As shown, the FPC 130 is attached to the rear side of the panel, and LEDs 140 of the FPC 130 are arranged such that their emitted light is directed through the perforations 150 of the panel 100.

Figure 2:
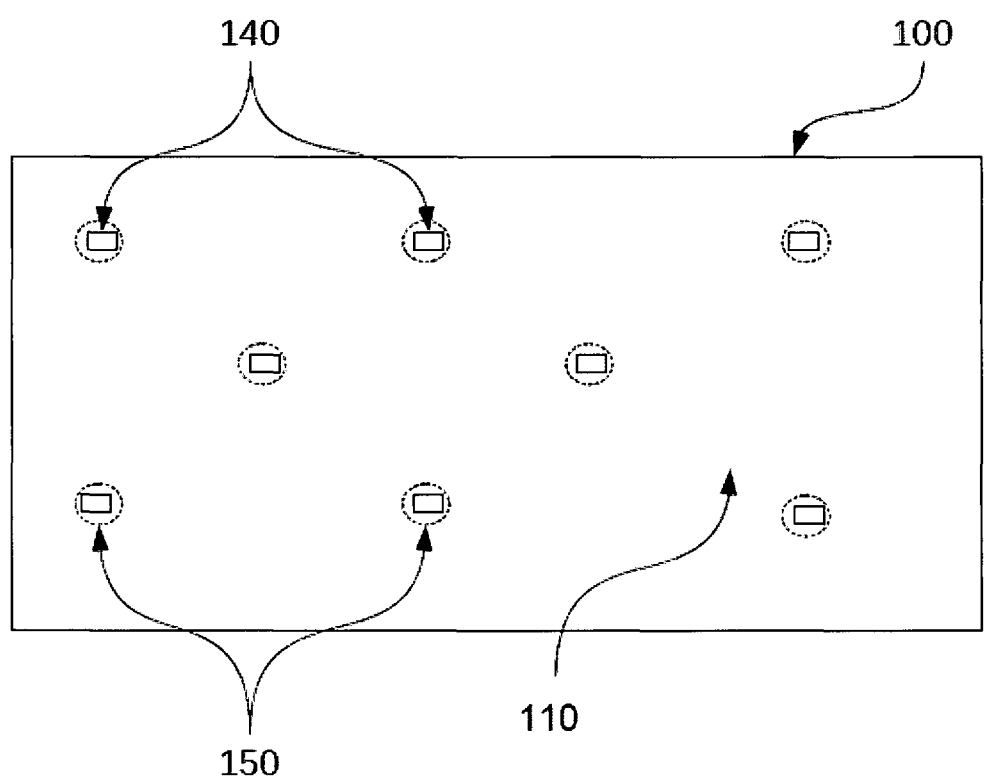
FIG. 2 outlines an illuminating acoustic panel.

FIG. 2 outlines an illuminating acoustic panel from the front side 110. The FPC is attached to the rear side 120 and is provided and arranged in such a way that the LEDs 140 are arranged within perforations 150. Depending on the desired effect of the illuminating acoustic panel, LEDs may be located at only some, clustered, in every second, or in each perforation 150 of the panel.

Figure 3:
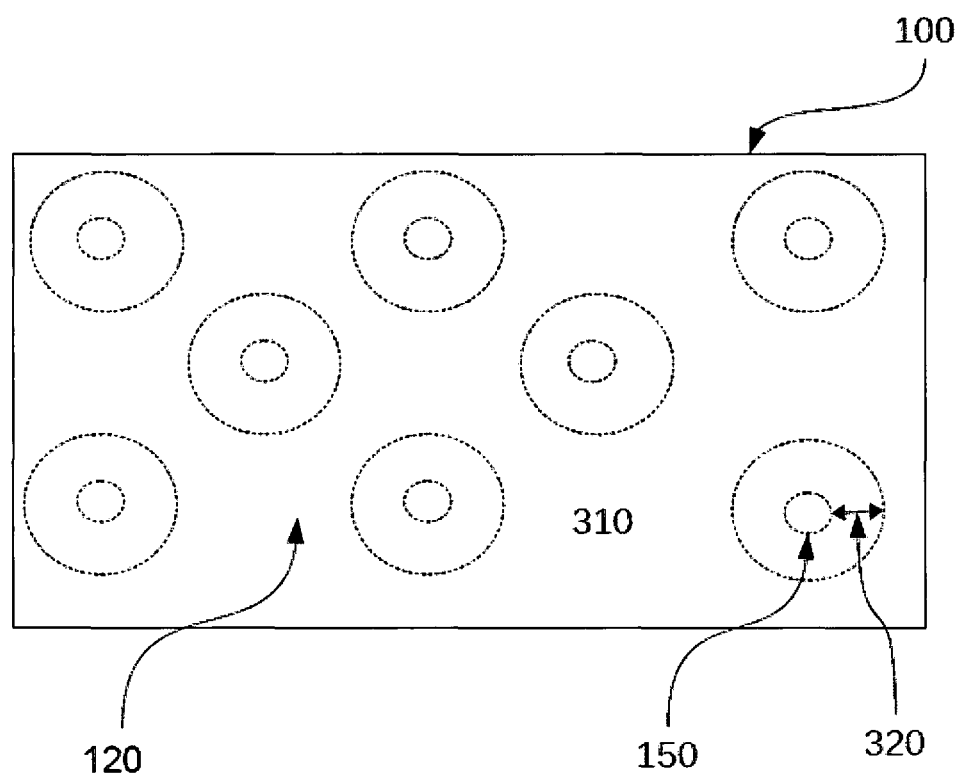
FIG. 3 outlines an illuminating acoustic panel with attachment margins.

FIG. 3 outlines an illuminating acoustic panel 100 from the rear side 120. The FPC is provided and positioned such that the LEDs 140 are arranged within the perforations 150. The FPC is attached to the panel at certain locations 310. Preferably, the panel comprises attachment free zones or margins 320 keeping a distance to the perforations, in order to allow for the FPC to vibrate and thus to prevent the reflection of sound waves. The attachment free margin 320 preferably comprises an area of 3 mm to 5 mm from the edges of each perforation 150, in order to facilitate sound wave to propagate through the FPC.

The LEDs are preferably emitting light perceived as white, such as by using broad-spectrum white LEDs. The LEDs may also have different colours that can individually be adjusted in intensity, in order to have an adaptable illumination with respect to intensity and to perceived colour or along the panel, resulting in a colour pattern, shape or image.

The illuminated acoustic panel can be used in wall or ceiling installations or as an acoustic sail/sound absorber with added illumination.

LIST OF REFERENCES 100 perforated acoustic panel
110 front side (of the panel)
120 rear side (of the panel)
130 flexible printed circuit layer (FPC)
140 Light Emitting Diode (LED)
150 perforation of the panel
160 panel core
310 FPC attachment
320 attachment free margin

The invention claimed is:

1. A perforated acoustic panel for mounting to a wall and/or a ceiling, the panel comprising:
    a visible front side and a rear side opposite the front side, the rear side being hidden when the panel is mounted; and
    a flexible printed circuit layer, FPC, attached to the rear side of the panel, the FPC comprising a plurality of LEDs, each LED arranged to be positioned to emit light through a perforation of the panel,
    wherein the FPC is attached to the perforated acoustic panel with an attachment comprising an attachment free margin around an entire outer periphery of each of the perforations which allow the FPC to vibrate with a sound wave that reaches the FPC.

2. The perforated acoustic panel according to claim 1, wherein the FPC is a paper FPC or a film FPC.

3. The perforated acoustic panel according to claim 1, wherein the panel comprises a panel core; and
    wherein walls of the perforations reflect light emitted from the LEDs through the perforation.

4. The perforated acoustic panel according to claim 3, wherein the LEDs are arranged such that light is emitted through some perforations of the panel.

5. The perforated acoustic panel according to claim 3, wherein the panel core is a gypsum core.

6. The perforated acoustic panel according to claim 1, wherein the LEDs are arranged such that light is emitted through each perforation of the panel.

7. The perforated acoustic panel according to claim 1, wherein the attachment free margin is between 3 mm to 5 mm.

8. The perforated acoustic panel according to claim 1, wherein the FPC is a paper FPC of less than 1.5 mm thickness.

9. The perforated acoustic panel according to claim 1, wherein the plurality of LEDs is emitting light perceived as white.

10. The perforated acoustic panel according to claim 9, wherein the LEDs are broad-spectrum LEDs.

11. The perforated acoustic panel according to claim 10, wherein the light perceived as white is emitted by a combination of primary colored, narrowband LEDs; and
    wherein light intensity and light color preferably is adjustable by adjusting the intensity of the LEDs of each primary color independently.

12. A method of producing a perforated acoustic panel, according to claim 1, comprising the steps:
    arranging an FPC on a rear side of a perforated acoustic panel such that each of a plurality of LEDs arranged on the FPC is located over a perforation of the panel; and
    attaching the FPC to the panel.

13. A use of a perforated acoustic panel according to claim 1 to illuminate a room.

14. The perforated acoustic panel according to claim 1, wherein the perforations are circular.

15. The perforated acoustic panel according to claim 1, wherein the attachment free margin around each of the perforations is circular.

16. The perforated acoustic panel according to claim 1, wherein a substrate of the FPC has a thickness of about 0.1 mm thick, and the LEDs have a thickness of about 0.8 mm.

17. The perforated acoustic panel according to claim 1, wherein the panel comprises a panel core which has a white color.

* * * * *